(12) United States Patent
Bartyzel et al.

(10) Patent No.: US 12,598,706 B2
(45) Date of Patent: Apr. 7, 2026

(54) METHOD OF INSERTING AN ELECTRONIC COMPONENTS IN THROUGH-HOLE TECHNOLOGY, THT, INTO A PRINTED CIRCUIT BOARD, PCB, BY AN INDUSTRIAL ROBOT

(71) Applicant: Fitech Sp. z o.o., Sucha Beskidzka (PL)

(72) Inventors: Grzegorz Marcin Bartyzel, Liszki (PL); Marcin Rosenhof, Cracow (PL)

(73) Assignee: Fitech Sp. z o.o., Sucha Beskidzka (PL)

( * ) Notice: Subject to any disclaimer, the term of this patent is extended or adjusted under 35 U.S.C. 154(b) by 162 days.

(21) Appl. No.: 18/466,488

(22) Filed: Sep. 13, 2023

(65) Prior Publication Data

US 2024/0098905 A1      Mar. 21, 2024

(30) Foreign Application Priority Data

Sep. 16, 2022   (EP) ..................................... 22461607
Nov. 3, 2022   (EP) ..................................... 22205362

(51) Int. Cl.
| | |
|---|---|
| *H05K 3/30* | (2006.01) |
| *B25J 13/08* | (2006.01) |
| *B25J 19/02* | (2006.01) |
| *G06T 7/00* | (2017.01) |
| *H05K 1/18* | (2006.01) |
| *H05K 13/04* | (2006.01) |
| *H05K 1/182* | (2026.01) |

(52) U.S. Cl.
CPC .............. *H05K 3/30* (2013.01); *B25J 13/085* (2013.01); *B25J 13/088* (2013.01); *B25J 19/023* (2013.01); *G06T 7/0004* (2013.01);

*H05K 13/0413* (2013.01); *G06T 2207/30148* (2013.01); *H05K 1/182* (2013.01)

(58) Field of Classification Search
CPC ............ H05K 3/30; G05B 2219/40532; G05B 2219/40584; B25J 19/023; B25J 13/085; B25J 9/1687
See application file for complete search history.

(56) References Cited

U.S. PATENT DOCUMENTS

| | | | | |
|---|---|---|---|---|
| 5,280,436 A | * | 1/1994 | Kubota .................. | B25J 9/1697 |
| | | | | 356/614 |
| 2017/0015002 A1 | * | 1/2017 | Ito .......................... | B25J 9/1674 |
| 2018/0183200 A1 | * | 6/2018 | Kobayashi ............. | H01R 43/26 |
| 2021/0224587 A1 | * | 7/2021 | Dingmann ............... | G06N 3/04 |

(Continued)

*Primary Examiner* — Wade Miles
*Assistant Examiner* — Mohammed Yousef Abuelhawa
(74) *Attorney, Agent, or Firm* — Ziegler IP Law Group, LLC.

(57) ABSTRACT

A method of inserting an electronic components in through-hole technology, THT, into a printed circuit board, PCB by an industrial robot, based on reinforcement learning, includes grabbing, by means of a tool with universal fingers mounted to the end-effector of the industrial robot, the electronic component to be inserted into the PCB; moving the tool to a starting position being in close proximity to a final position of the electronic component; acquiring at least one image showing the tool, the electronic component and the PCB; calculating, on a basis of the at least one image, at least one movement instruction for the industrial robot; adjusting position of the tool on a basis of the at least one movement instruction, and repeating the steps until the electronic component is in the final position.

16 Claims, 3 Drawing Sheets

(56) References Cited

U.S. PATENT DOCUMENTS

2023/0166400 A1* 6/2023 Zeng ........................ B25J 9/163
700/254
2023/0330858 A1* 10/2023 Solowjow .............. B25J 9/1697

* cited by examiner

METHOD OF INSERTING AN ELECTRONIC COMPONENTS IN THROUGH-HOLE TECHNOLOGY, THT, INTO A PRINTED CIRCUIT BOARD, PCB, BY AN INDUSTRIAL ROBOT

TECHNICAL FIELD

The aspects of the disclosed embodiments are directed to the method of inserting an electronic components in through-hole technology, THT, into a printed circuit board, PCB, by an industrial robot. This method is based on reinforcement learning (RL) algorithms.

PRIOR ART

One of the robotics challenges in the modern manufacturing industry are assembling tasks. There are various insertion problems in the manufacturing industry, from the peg-in-hole tasks to the electronic parts assembly. In the most of conventional methods currently used for this problem, an industrial robot is controlled by the hybrid force-position control and performs preprogrammed trajectory such as a spiral path. However, due to the complex geometry and susceptibility to damage, electronic parts require more sophisticated methods.

Robotic solutions for assembly on production lines are mainly based on compliance control systems. In those applications, industrial robots are controlled by impedance or admittance controllers. Those methods perform programmed trajectories while holding a constant downforce. Also, they require manual parameters tuning, which is a time-consuming process. The methods based only on the compliance control system require high precision of the sensors and well-made robotized production machine. Using machine vision and deep learning for insertion tasks can reduce the impact of those factors.

Publication "*Fast peg-and-hole alignment using visual compliance. In:* 2013 *IEEE/RGSJ International Conference on Intelligent Robots and Systems*, pp. 286(292(2013)" describes an example of the pure vision system for this task. In this work, instead of using a force control system, a high-speed machine vision is used for aligning a peg in a hole.

In the prior art, there are known methods in which deep learning-based solutions are presented. This methods use convolution neural networks (CNN) to compute an insertion target pose precisely. Next, this computed pose is used as an input to the trajectory generator algorithm.

SUMMARY

A method of inserting an electronic components in through-hole technology, THT, into a printed circuit board, PCB, by an industrial robot, comprising steps of:
  a) grabbing, by means of a tool mounted to the end-effector of the industrial robot, the electronic component to be inserted into the PCB;
  b) moving the tool to a starting position being in close proximity to a final position of the electronic component;
  c) acquiring at least one image showing the tool, the electronic component and the PCB;
  d) calculating, on a basis of the at least one image, at least one movement instruction for the industrial robot;
  e) adjusting position of the tool on a basis of the at least one movement instruction;

f) repeating steps c), d), and e) until the electronic component is in the final position.

Preferably, the at least one image is taken by a camera attached to the industrial robot, preferably the camera is attached to the tool.

Preferably, the at least one image is generated by merging at least two auxiliary images showing the tool, the electronic component and the PCB, wherein each auxiliary image is taken from different perspective.

Preferably, the at least one image is generated by merging two auxiliary images, preferably one of the auxiliary images shows a first side of the tool, the other auxiliary image shows a second side of the tool, and the at least one image shows 360 degree-like vision.

Preferably, the at least one image is downsized before step d), preferably to 128×128 pixels.

Preferably, the step d) is performed by a neural network, preferably a convolution neural network, CNN.

Preferably, the step d) provides the at least one movement instruction which provides relative movement instructions.

Preferably, in step d) an admittance controller is used to provide an absolute tool position on a basis of the at least one movement instruction.

Preferably, the admittance controller operates on an equation $$\ddot{x}(t)=M^{-1}(\, \mathcal{W}^{ext}(t)-D\dot{x}(t)-K(x(t)-x_d))$$

where K, D and M represent respectively stiffness, damping and inertia matrices, and where the $\mathcal{W}^{ext}$ is represents the contact forces, $x_d$ and $x(t)$ represent respectively the final position and a current position. The control signal is first computed by integrating the acceleration $\ddot{x}$ and the obtained velocity $\dot{x}$.

Preferably, the step d) provides the at least one movement instruction on a basis of:
  the at least one image, and
  a measurement taken by a force sensor, and/or a measurement taken by a torque sensor, and/or a robot position information.

Preferably, the tool is restricted within a workspace, preferably the workspace has a cylinder shape.

Preferably, the step f) is performed a limited number of times, preferably 25-200 times, even more preferably 50 times.

Preferably, during step e) a maximal movement and a maximal rotation are defined, preferably during step e) the tool may move up to 1-5 mm and may be rotated up to 0.5-2° per single iteration.

Preferably, the movement instructions are sent periodically, preferably with a frequency of 2-20 Hz, preferably 10 Hz.

Preferably, the starting position is 2-15 mm above the PCB and is up to 3-10 mm, preferably 7 mm, away from the final position.

DETAILED DESCRIPTION

Figure 1:
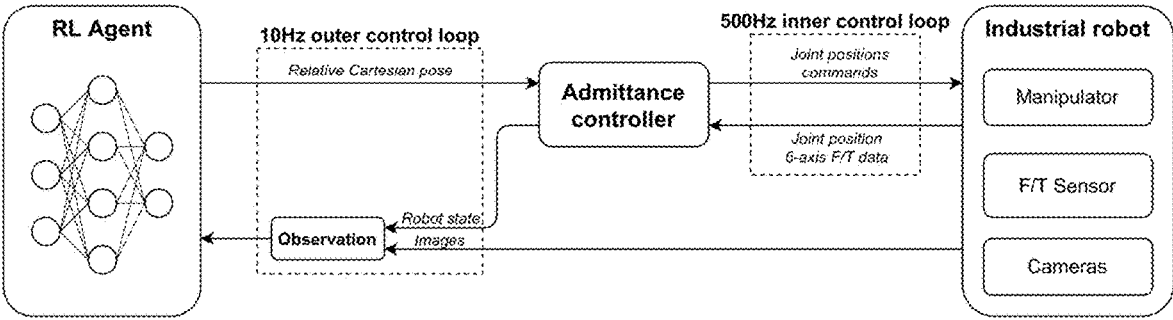
FIG. 1 is a schematic block diagram of a workflow incorporating aspects of the disclosed embodiments.

A method of inserting an electronic components in through-hole technology, THT, into a printed circuit board, PCB 3, by an industrial robot 1 was schematically described on a block-diagram presented in FIG. 1. This method integrates the Soft Actor-Critic (SAC) algorithm with the admittance control system. SAC is an off-policy RL algorithm based on maximal entropy. This algorithm aims to maximize the expected reward and also optimize maximal entropy. The temperature parameter controls the agent exploration. This parameter can be fixed throughout the learning or optimized. SAC uses a replay buffer for sampling data collected during training, like other off-policy algorithms.

The presented system consists of two control loops. In the outer loop, the controlling element is the SAC algorithm, and in the inner control loop, the admittance control system is used.

The RL agent sends a command to the admittance controller at a frequency of 10 Hz and receives feedback information with the same frequency from the collection of drivers. The pose and 6-axis F/T data are received from the admittance controller.

The image is acquired from the camera's drivers running independently from the controller. To achieve such control frequency during learning, we integrate the SAC algorithm with distributed learning architecture called Ape-X. This architecture assumes a single process for computing and applying gradients called learner and processes for data collection called actors. Actors send trajectories to the replay buffer from which learner samples mini-batches. Preferably, the learner periodically synchronizes the network parameters with the actors. More preferably, the one actor is used, which results with asynchronous training process.

The RL agent measures the current state as a multimodal observation. This observation is defined as a fusion of RGB image acquired from the tool mounted to the end-effector, 6-axis force-torque (F/T) data acquired from the F/T sensor and the relative pose of the Tool Centre Point (TCP) to the mounting pose. The orientation is represented as a quaternion, so the feature vector has 13 values in total. Agent observes two concatenated source images, taken from two cameras mounted to the end-effector. The output size of the concatenated image is 1024×1024 pixels in the RGB colour space. Using such images would be computationally demanding, so the desired image is down-sampled to 128×128 pixels. It is possible to use any image resolution but the person skilled in the art would know, that an image size (both width and height) should be described as a power of 2 for better computation results. In the case of the present invention following image sizes have been tested: 32×32, 64×64, 128×128, 256×256. It should be noted that in all cases the method according to the invention worked. Smaller resolutions have an advantage of a computation time and a learning time needed for an AI to study images. Higher resolution provides better precision of an final assembly. In the case of the present invention the resolution of 128×128 provides a best compromise between the computation time and the precision.

In the second embodiment, constraints for the RL agent were implemented. The workspace is defined as a cylinder with a radius of 7 mm and limitless height. The radius may take any reasonable value. It has been tested for 3-10 mm and with a smaller radii there is a greater chance that some noise and disturbance may cause unwanted results. Preferably, the maximum rotation about each axis is 10. The agent begins the episode 2-15 mm above the PCB surface. In the case of an area with a high number of components it may be beneficial to start from higher distance from the PCB.

Each trial lasts up to 50 steps. During a single step agent executes the action a t=[p$_t$, θ$_t$], where p t is a displacement vector, θ$_t$ is a rotation vector. The range of the action space is [−1.0, 1.0] mm (may be increased to +/−5 mm) for displacements and [−0.5°, 0.5° ] (may be increased to +/−2°) for rotations. Lower values provides better results during a training process. For each non-terminal step, the agent receives a reward $$r=-\tanh(\alpha \cdot d)$$

Where d is a l$_2$ distance between TCP and full insertion pose, α is a reward sensitivity coefficient.

For safety purposes, the episode is interrupted when the agent leaves the workspace, exceeds the time, or exceeds the rotation limit. The reward is the same as in the non-terminal steps for the first two cases. However, when the termination occurs due to the rotation limits, the agent receives r=−2. Such an explicit penalty for rotation limit violation was dictated by the possibility of damaging the camera cables connected to the vision tool. The task is considered completed when the TCP relative position p$^z$ on the Z-axis is lower or equal to 0.0 mm, which means the electronic part is inserted in the target position. In this situation the received reward is r=10.

Figure 2:
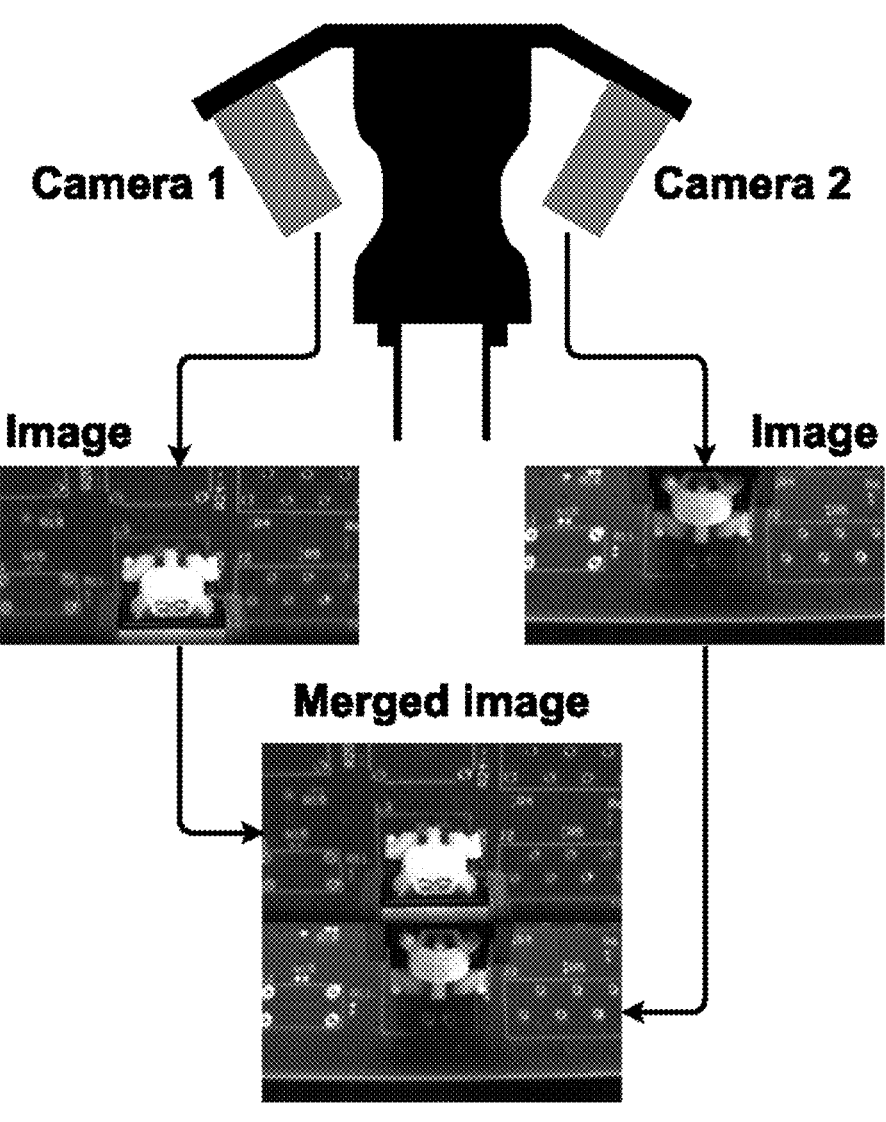
FIG. 2 shows an image concatenated from two cameras mounted to the robot tool in accordance with the aspects of the disclosed embodiments.

FIG. 2 shows Image concatenated from two cameras mounted to the robot tool. Both raw images are of size 1024×512. Camera 1 is pointing to the left side of the gripper 2 and respectively camera 2 to the right side. Output image gives 360 degree-like vision.

In the method according to the invention, the admittance controller is used to provide an absolute tool position on a basis of the at least one movement instruction. This admittance controller operates in the task space to assemble the electronic parts susceptible to the applied forces safely. The general equation for this control system is as follows:

$$\ddot{x}(t)=M^{-1}(\,\mathcal{W}^{ext}(t)-D\dot{x}(t)-K(x(t)-x_d))$$

where K, D and M represent respectively stiffness, damping and inertia matrices. The $\mathcal{W}^{ext}$ (t) represents the contact forces, x(t) and x$_d$ represent respectively desired and current pose. The control signal is first computed by integrating the acceleration $\ddot{x}$ and the obtained velocity $\dot{x}$. Admittance control, compared to the hybrid force position control, allows to control the robot with a high frequency in the task space and to be compliant with the obstacles on the executed trajectory.

Figure 3:
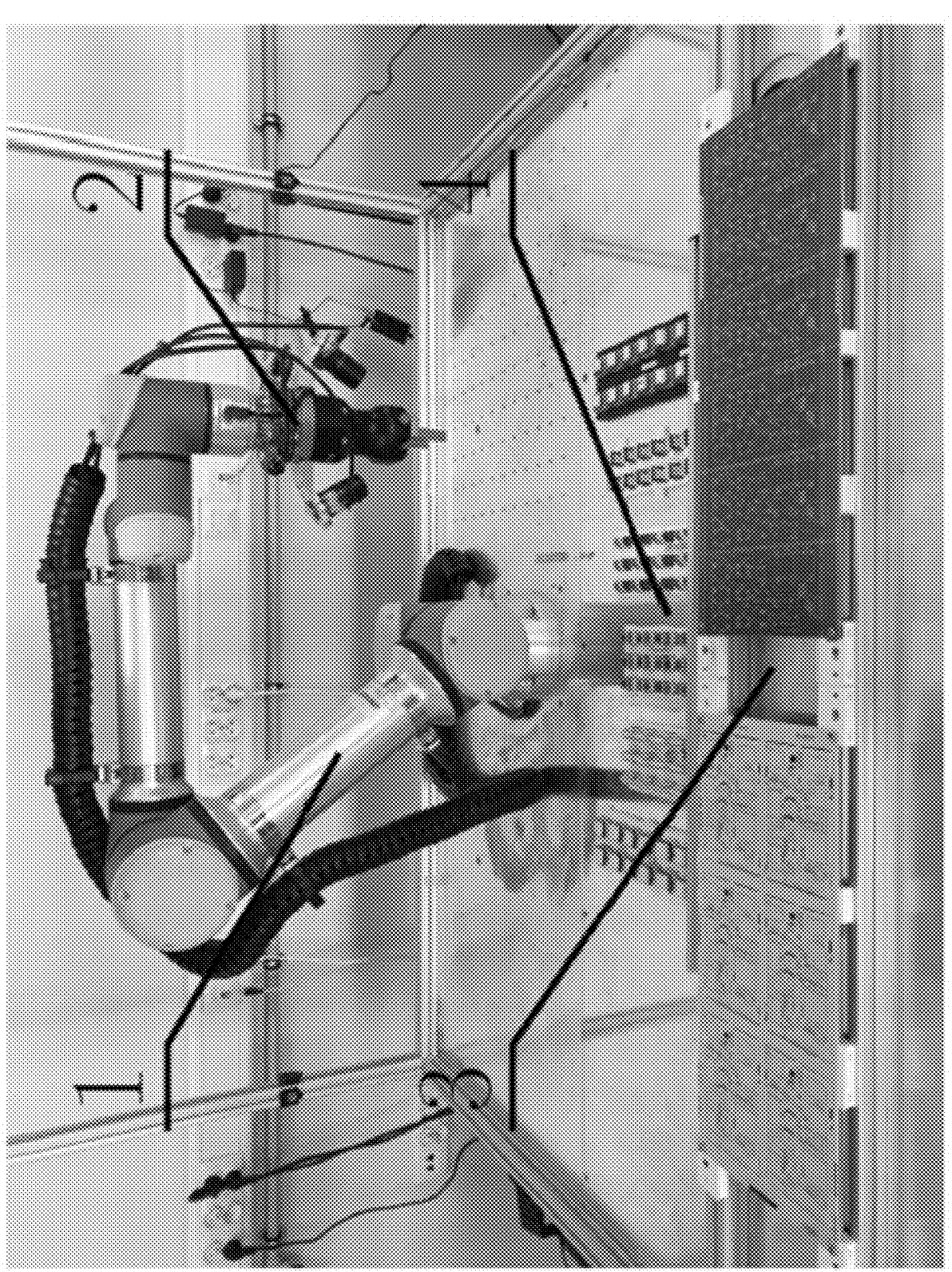
FIG. 3 illustrates a laboratory stand for use with aspects of the disclosed embodiments.

The method according to the invention is conducted by the laboratory stand, which was shown in FIG. 3. This laboratory stand includes the following devices: the industrial robot 1 Universal Robot UR5e-series 1, the servo-electric gripper 2 2, 6-axis F/T sensor and custom-made vision tool. Various PCB 3s 3 and electronic components are placed in the robot workspace. The electronic parts are placed in the printed trays 4. Such a setup allows to achieve conditions similar to those on the production line.

A method of inserting an electronic components in through-hole technology, THT, into a printed circuit board, PCB 3, by an industrial robot 1, comprising a following steps. First step, step a), is a grabbing steps, performed by means of a tool mounted, preferably with universal fingers, to the end-effector of the industrial robot 1, during which the electronic component to be inserted into the PCB 3. Nest step b) is performed, where the tool is moved to a starting position being in close proximity to a final position of the electronic component. After that a step c) is performed, that is acquiring at least one image showing the tool, the electronic component and the PCB 3. Next a step d) is performed where on a basis of the at least one image, at least one movement instruction for the industrial robot 1 is calculated. After that a step e) is performed, that is adjusting position of the tool on a basis of the at least one movement instruction. Steps c), d) and e) are performed until the electronic component is in the final position. This is checked in a step f).

At least one image is taken by a camera attached to the industrial robot 1. Preferably the camera is attached to the tool. It should be noted that more than one camera may be used to obtain proper results. This arrangement where the camera is attached to the tool is beneficial due to the fact that the camera always will be able to capture an interesting area, where the electronic component should be placed, since the tool is not able to cover the interesting area.

At least one image is generated by merging at least two auxiliary images showing the tool, the electronic component and the PCB 3, wherein each auxiliary image is taken from different perspective. This solution provides a semi-panoramic image which allows to view the electronic component from a different perspective in one image. Such solution provides a better input for further processing.

What Is more, at least one image is generated by merging two auxiliary images, preferably one of the auxiliary images shows a first side of the tool, the other auxiliary image shows a second side of the tool, and the at least one image shows 360 degree-like vision. This enables the full and precise indication of the place in which the component should be inserted.

Calculating, on a basis of the at least one image, at least one movement instruction for the industrial robot 1 is performed by a neural network, preferably a convolution neural network, CNN. This provides the at least one movement instruction which provides relative movement instructions. In this step an admittance controller is used to provide an absolute tool position on a basis of the at least one movement instruction. This step also provides the at least one movement instruction on a basis of the at least one image and a measurement taken by a force sensor, and/or a measurement taken by a torque sensor, and/or a robot position information.

The tool using in the method according to the invention is restricted within a workspace, preferably the workspace has a cylinder shape. This feature on one hand is limiting the workspace and thus provides a condition limiting calculation. On the other hand it increase safety for a workers and will prevent any damages in the case of unpredicted circumstances.

The examination is repeated until the electronic component is in the final position, wherein this examination is performed a limited number of times, preferably 25-200, even more preferably 50 times. After that, if the electronic component is not set in place, an alarm may be set on. This limitation depends on a height from which the industrial robot 1 starts—higher starting points usually requires more steps.

Preferably, the movement instructions are sent periodically, preferably with a frequency of 2-20 Hz, preferably 10 Hz. In the case of the movement instructions a lower frequency provides a greater precision and a higher frequency reduces a time needed to finish an assembly. A 10 Hz frequency is an optimal value with a sufficient precision and a good assembling time.

What is claimed is:

1. A method of inserting an electronic components in through-hole technology (THT) into a printed circuit board (PCB) by an industrial robot, comprising steps of:

a) grabbing, by means of a tool mounted to an end-effector of the industrial robot, the electronic component to be inserted into the PCB;

b) moving the tool to a starting position being in close proximity to a final position of the electronic component;

c) acquiring at least one image showing the tool, the electronic component and the PCB and downsizing the at least one image to 128×128 pixels;

d) calculating, on a basis of the at least one image, at least one movement instruction for the industrial robot, wherein an admittance controller is used to provide an absolute tool position on a basis of the at least one movement instruction and the admittance controller operates on an equation $$\ddot{x}(t)=M^{-1}(W^{ext}(t)-D\dot{x}(t)-K(x(t)-x_d))$$

where K, D and M represent respectively stiffness, damping and inertia matrices, and where the $W^{ext}(t)$ is represents the contact forces, $x_d$ and x(t) represent respectively the final position and a current position, and a control signal is first computed by integrating the acceleration $\ddot{x}$ and the obtained velocity $\dot{x}$;

e) adjusting a position of the tool on a basis of the at least one movement instruction; and f) repeating steps c), d), and e) until the electronic component is in the final position.

2. The method according to claim 1, wherein the at least one image is taken by a camera attached to the industrial robot.

3. The method according to claim 1, wherein the at least one image is generated by merging at least two auxiliary images showing the tool, the electronic component and the PCB, wherein each auxiliary image is taken from different perspective.

4. The method according to claim 3, wherein the at least one image is generated by merging two auxiliary images, wherein one of the auxiliary images shows a first side of the tool, and an other auxiliary image shows a second side of the tool, and an output image provides a 360-degree vision.

5. A method of inserting an electronic component in through-hole technology (THT) into a printed circuit board (PCB) by an industrial robot, comprising steps of:

a) grabbing, by means of a tool mounted to an end-effector of the industrial robot, the electronic component to be inserted into the PCB;

b) moving the tool to a starting position that is 2-15 mm above the PCB and is up to 3-10 mm away from a final position of the electronic component;

c) acquiring at least one image showing the tool, the electronic component and the PCB;

d) calculating, on a basis of the at least one image, at least one movement instruction for the industrial robot, wherein an admittance controller is used to provide an absolute tool position on a basis of the at least one movement instruction and the admittance controller operates on an equation:

$$\ddot{x}(t)=M^{-1}(W^{ext}(t)-D\dot{x}(t)-K(x(t)-x_d))$$

where K, D and M represent respectively stiffness, damping and inertia matrices, and where the $W^{ext}(t)$ is represents the contact forces, $x_d$ and x(t) represent respectively the final position and a current position, and a control signal is first computed by integrating the acceleration $\ddot{x}$ and the obtained velocity $\dot{x}$;

e) adjusting a position of the tool on a basis of the at least one movement instruction; and f) repeating steps c), d), and e) until the electronic component is in the final position.

6. The method according to claim 1, wherein the step d) is performed by a neural network.

7. The method according to claim 1, wherein the step d) provides the at least one movement instruction which provides relative movement instructions.

8. The method according to claim 1, wherein the step d) provides the at least one movement instruction on a basis of:
    the at least one image, and
    a measurement taken by one or more of a force sensor, a torque sensor, or a robot position information.

9. The method according to claim 1, wherein the tool is restricted within a workspace, and the workspace has a cylinder shape.

10. The method according to claim 1, wherein the step f) is performed a limited number of times.

11. The method according to claim 10, wherein during step e) a maximal movement and a maximal rotation are defined.

12. The method according to claim 1, wherein the movement instructions are sent periodically with a frequency in a range of 2-20 Hz.

13. The method according to claim 1, wherein the starting position is 2-15 mm above the PCB and is up to 3-10 mm away from the final position.

14. The method according to claim 11, wherein the maximal movement is in a range of 1-5 mm and the maximal rotation is in the range of 0.5-2 degrees per single iteration.

15. A method of inserting an electronic component in through-hole technology (THT) into a printed circuit board (PCB) by an industrial robot, comprising steps of:
    a) grabbing, by means of a tool mounted to an end-effector of the industrial robot, the electronic component to be inserted into the PCB;

b) moving the tool to a starting position that is 2-15 mm above the PCB and is up to 3-10 mm away from a final position of the electronic component;
    c) acquiring at least one image showing the tool, the electronic component and the PCB and downsizing the at least one image to 128×128 pixels;
    d) calculating, on a basis of the at least one image, at least one movement instruction for the industrial robot, wherein an admittance controller is used to provide an absolute tool position on a basis of the at least one movement instruction and the admittance controller operates on an equation:

$$\ddot{x}(t)=M^{-1}(W^{ext}(t)-D\dot{x}(t)-K(x(t)-x_d))$$

where K, D and M represent respectively stiffness, damping and inertia matrices, and where the $W^{ext}$ (t) represents the contact forces, $x_d$ and x(t) represent respectively the final position and a current position, and a control signal is first computed by integrating the acceleration $\ddot{x}$ and the obtained velocity $\dot{x}$; and wherein the at least one movement instruction is further generated by a reinforcement-learning agent implementing a Soft Actor-Critic (SAC) algorithm that exchanges commands and feedback with the admittance controller at a frequency of about 10 Hz, the feedback comprising six-axis force-torque data and relative tool-center-point pose information;
    e) adjusting a position of the tool on a basis of the at least one movement instruction; and
    f) repeating steps c), d), and e) until the electronic component is in the final position.

16. The method according to claim 5, wherein the at least one image is downsized before step d) to 128×128 pixels.

* * * * *